April 26, 1966 A. J. CLARK 3,247,939

POSITIONING MECHANISM

Filed Oct. 25, 1963 2 Sheets-Sheet 1

INVENTOR.
Alfred J. Clark,
BY Mueller & Aichele
Attys.

INVENTOR.
Alfred J. Clark,
BY Mueller & Aichele
Attys.

United States Patent Office 3,247,939
Patented Apr. 26, 1966

3,247,939
POSITIONING MECHANISM
Alfred J. Clark, Palatine, Ill., assignor to Motorola, Inc., Franklin Park, Ill., a corporation of Illinois
Filed Oct. 25, 1963, Ser. No. 318,937
10 Claims. (Cl. 192—142)

This invention relates to pushbutton tuning apparatus and more particularly to pushbutton tuning apparatus equipped for automatic tuning by remote control.

Many radio receivers for automobiles and similar vehicles are equipped with pushbutton operated tuners. The pushbuttons are generally located on the dashboard of the automobile and are depressible to displace a corresponding number of tuner slides. Each of the slides carries a presetable cam which engages a treadle bar mechanism for positioning the tuner at a predetermined frequency. This enables the driver of the automobile to tune the radio receiver with a minimum of distraction. It would be desirable in certain circumstances to extend the convenience of pushbutton operation to various other locations in the automobile so that passengers, as well as the driver, could easily operate the tuning of the radio receiver. Such a convenient automatic pushbutton control might be additionally advantageous if positioned on the steering wheel or proximate thereto to enable the drive to operate the tuner without reaching to the dash board to manually depress the pushbuttons.

Certain other types of electronic equipment may be advantageous equipped with presetable pushbutton operation. For example, the UHF tuner in a television reciever could be so equipped. The relatively wide range of UHF frequencies may contain but a few channels at any location, making ordinary manual tuning tedious. It may be desirable, therefore, to equip the television receiver with a plurality of presetable pushbutton operated tuner slides which may be programmed to the particular UHF channels desired within the broad UHF frequency range. This facilitates tuning in the UHF range since the desired channel may be selected merely by pressing the appropriate pushbutton. As certain television receivers are equipped with remote control for the UHF channels, a corresponding remote control system may be desired for UHF channels selected by pushbutton.

Accordingly, it is an object of this invention to provide improved tuning apparatus permitting of both manual and automatic operation of pushbuttons.

Another object of the invention is to provide pre-programmed pushbutton tuning apparatus capable of remote control operation while still being manually operable.

A feature of the invention is the provision, in a manual pushbutton slide type tuner, of a plurality of fingers on a drive shaft for successively actuating the slides, and of clutch means for causing the fingers to slip on the drive shaft when their associated slides reach the limit of their travel.

Another feature of the invention is the provision, in a manual pushbutton slide type tuner, of a motor driven drive shaft with a plurality of discs freely rotatable thereon, each disc having a projecting finger engagable with a corresponding slide. The discs are successively driven by a plurality of members fixed on the shaft, each member being engageable with a detent ball in its associated disc which slips after the slide reaches the limit of its travel.

Still another feature of the invention is the provision, on the motor driven drive shaft of an automatically operable pushbutton slide tuner, of fingers on the drive shaft successively operating the slides, and of an index cam on the shaft for de-energizing the motor after each slide is moved.

Another feature of the invention is the provision, on the motor driven drive shaft of an automatically operable pushbutton slide tuner, of fingers on the drive shaft successively operating the slides, and of a presetable index switch system which is operable by the drive shaft to de-energize the motor after movement of a predetermined control member according to the setting of the index switch system.

In accordance with the invention, a wave signal receiver is provided with tuning apparatus which includes a plurality of pushbutton slides, each being depressible to adjust the tuner to a particular pre-programmed frequency. A motor driven shaft is provided at the rear of the tuner and carries a plurality of discs which are freely rotatable with respect to the drive shaft. Each of the discs has a projecting finger extending therefrom to engage a portion of a respective one of the slides for moving the same in the direction of its operation for adjusting the tuner automatically. Each of the discs is provided with an opening which carries a detent ball. A drive member with an annular ball race is mounted adjacent each disc. The drive members are fixed to the drive shaft and each of the detent balls is biased in its respective ball race by a resilient plate on the opposite sides of the disc from the drive member. A projection in each of the ball races engages the respective balls to drive the disc for operating the slides. The balls are staggered about the drive shaft so that the slides are successively operable as the shaft rotates. When a slide reaches the limit of its travel, the ball is depressed against the resilient plate by the projection and the projection rides over the ball to allow the finger and disc to slip on the drive shaft.

The drive shaft may be provided with indexing means to de-energize the driving motor at a convenient time. One arrangement is to utilize an indexing cam driven by the drive shaft, which cam opens a switch in the motor energizing circuit just subsequent to the operation of each slide. Another embodiment of the invention utilizes a first group of contacts each corresponding to one of the slides and selectively engageable by a grounded presetable movable contact. A second group of contacts is connected in series in the motor energizing circuit and the contacts of the second group are successively disengageable from the motor energizing circuit as the drive shaft rotates. Each contact of the second group. group is connected to a respective contact of the first group and accordingly, the motor is de-energized when the contact of the second group connected to the grounded contact of the first group is disengaged from the motor's circuit.

Figure 1:
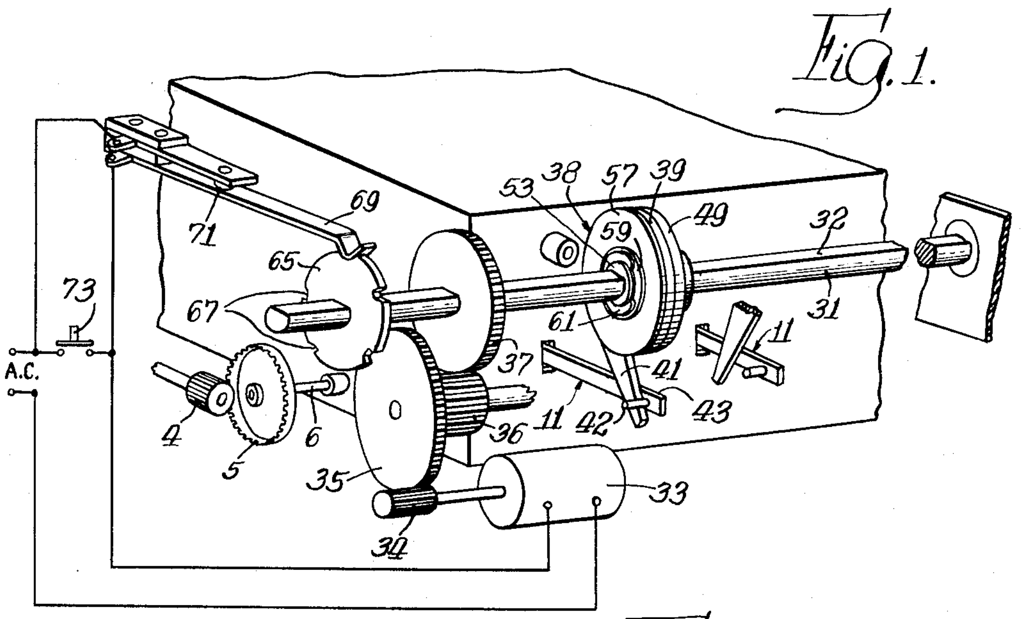
FIG. 1 is a perspective view of a pushbutton slide tuner constructed in accordance with the invention.
Figure 4:
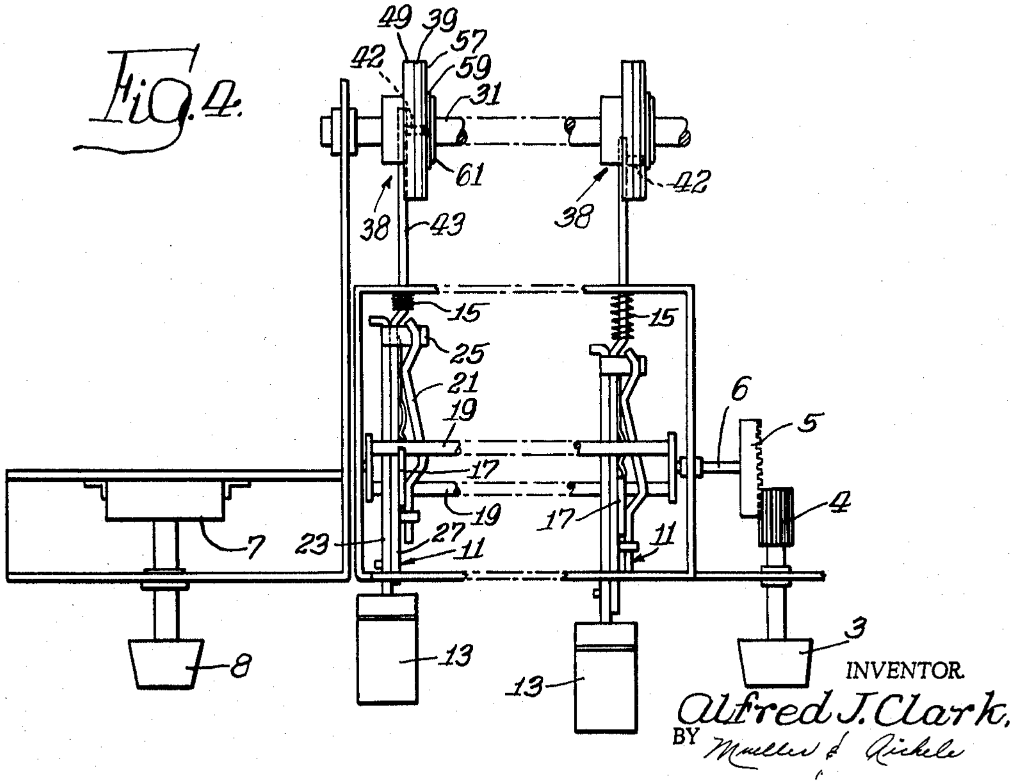
FIG. 4 is a top plan view of a portion of the tuner constructed in accordance with the invention.

Referring now more particularly to the drawing, in FIGS. 1 and 4 the nature of the tuning system itself may be discerned. The tuner shown is of the type used in automobile radio receivers and comprises a manual tuning knob 3 connected through drive gears 4 and 5 to a tuning shaft 6. Tuning shaft 6 drives a tuning carriage (not shown) which varies the position of slug tuned coil units as is known in the art. Volume control is accomplished by a rheostat 7 driven by a volume control knob 8. The tuner may also be controlled by a plurality of presettable pushbutton slides 11 which are depressible by pushbutton 13 against the bias of springs 15 to cause a presettable cam 17 to engage a pair of treadle bars 19. Engagement of treadle bars by cam 17 moves the tuning carriage 5 which in turn varies the position of slug tuned coil units 6. An example of a tuner of this general nature is shown in the patent issued to R. E. Thompson, No. 2,793,531, and assigned to the assignee of the present invention. The cams 17 may be preset by releasing a locking lever 21 from bearing against the cam. This is done by drawing outwardly on pushbutton 13 to move bar 23, which carries a locking hook 25, with respect to the bar 27 which carries the pivotal cam 17.

As a result of such a construction, the pushbutton slide tuner may be pre-programmed by unlocking the pushbuttons, setting the tuner to a desired frequency, and depressing one of the pushbuttons 13 to lock one of the cams 17 at that position of the treadle bar 19. Thus, where the tuner contains five pushbutton slides, for example, five different frequencies may be pre-programmed by locking the cams on the respective slide members in appropriate positions. This makes tuning especially convenient to a driver of an automobile since all he need do to tune the radio receiver is to depress a particular pushbutton for the station to be selected. It may, however, be desirable under certain circumstances to permit pushbutton tuning to be accomplished from other locations in the automobile. For example, a person in the back seat may wish to tune the receiver to a particular station, or the driver may wish to control the tuner without reaching for the pushbuttons. Accordingly, a remote control system for actuating the tuner is desirable.

Figure 2:
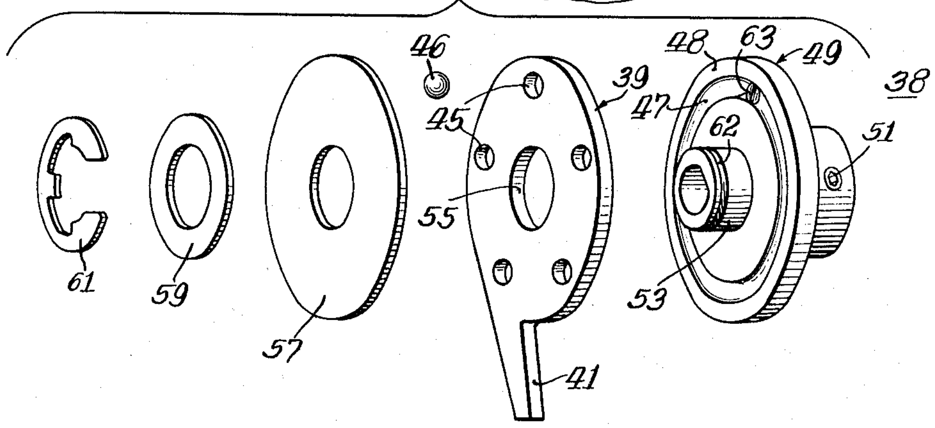
FIG. 2 is an exploded view of the clutch and finger assembly of FIG. 1.

Referring now to FIGS. 1, 2 and 4, a mechanism for actuating a pushbutton slide tuner is shown constructed in accordance with the invention. A drive shaft 31 is provided with a flat 32 thereon and is driven by a motor 33 through gears 34, 35, 36 and 37. A plurality of drive units 38 are spaced along shaft 31 and each unit includes a disc 39 which is freely rotatable with respect thereto. The number of drive units 38 corresponds to the number of slides to be actuated and each disc 39 includes a projecting finger 41 which is engageable with a pin 42 on an extension 43 of slide bar 27 of slide 11.

Figure 3:
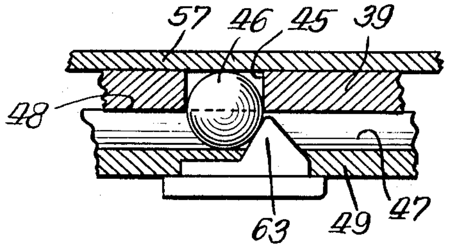
FIG. 3 is a half sectional view of the detent mechanism for the clutch assembly.

Referring now more particularly to FIGS. 2 and 3 it may be seen that discs 39 have a plurality of holes 45 therein. A detent ball 46 is carried in one of holes 45 and in a ball race 47 provided in the abutting face 48 of a drive member 49. Drive member 49 is secured to be rotatable with shaft 31 by means of a set screw 51 which bears against the flat 32 of shaft 31. A bushing 53 extends from drive member 49 through the center hole 55 of disc 39. Disc 39 is freely rotatable on bushing 53 and hence is freely rotatable about shaft 31. A resilient plate 57 is mounted on bushing 53 against the opposite side of disc 39 from drive member 49, and washer 59 and lock washer 61, which latter washer locks in a groove 62 on bushing 53, hold the drive unit 38 together. Spring plate 57 resiliently biases detent ball 46 in ball race 47.

Ball 46 is placed in the one of holes 45 corresponding to the desired sequence at which the slide associated with that particular disc is to be operated. A detent projection 63 in ball race 47 will engage ball 46 as drive member 49 is rotated by shaft 32. Projection 63 may be in the same position relative to shaft 31 on all of drive members 49. However, as mentioned above, balls 46 are staggered about the circumference of the various plates 39 so that the plates will be successively operated as the various projections 63 engage the various balls 46.

Upon actuation of motor 33, shaft 31 will rotate to cause projection 63 to engage ball 46. Plate 41 will therefore be driven with drive member 49 and shaft 31 so that finger 41 will move slide 11 against the bias of spring 15 until cam 17 engages treadle bars 19, thereby setting the tuner. Once cam 17 engages treadle bars 19, the force opposing continued movement of the slide 11 will cause projection 63 to depress the ball 46 against the resilience of plate 57. The projection 63 will then slip past the ball permitting spring 15 to return slide 11 to its normal undepressed position. The detent mechanism shown therefore acts as a clutch which engages successive ones of the fingers 41 to be driven by the shaft 31 and which disengages the same as the key slide associated therewith reaches the limit of its displacement.

Returning now to FIG. 1 it will be seen that an index cam 65 is driven by shaft 31. Cam 65 contains a plurality of depressions 67 therein corresponding to the position of shaft 31 just subsequent to each disengagement of a respective clutch assembly. Cam follower 69 rides on cam 65 and is displaced upon alignment with a depression 67 to open contacts 71. Contacts 71 are in the motor energizing circuit for motor 33 and hence will de-energize the motor to stop further actuation of the slide members. A start switch 73 is provided for initially bypassing contacts 71 to start motor 73 for movement to a different position.

Accordingly, to tune the receiver, button 73 which may be remotely actuated is closed to energize motor 33 momentarily. As motor 33 turns, cam follower 69 will ride out of depression 67 to close contacts 71 holding motor 33 energized. Motor 33 will then drive shaft 31 to cause rotation of the particular disc and finger on which the detent ball 46 is engaged by projection 63 according to the predetermined sequence. This unit will turn until the tuner is moved to a position corresponding to the setting of the particular slide which the unit drives. As the detent clutch disengages and the slide returns to normal position, another of depressions 63 will align itself with cam follower 69, opening contact 71 and de-energizing motor 33. If it is desired to proceed further in the sequence, all that need be done is to depress switch 73 once again. A plurality of switches 73 may be provided at different locations to permit remote tuning from different positions.

Figure 5:
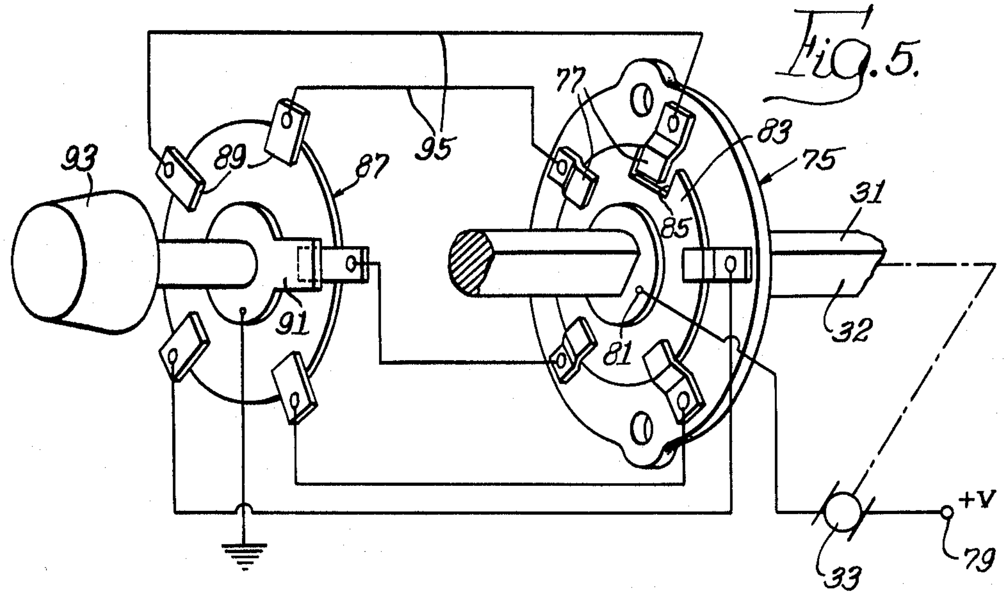
FIG. 5 is a partially perspective an dpartially schematic view of an alternative type of control in accordance with the invention.

It may be desirable to provide a control unit wherein it is not necessary to depress an actuating button for each operation in the tuning sequence. Accordingly, a control unit may be designed as shown in FIG. 5. Here a switch 75 is provided with a plurality of contacts 77. Motor 33 is connected to a positive source of voltage 79 and the other side of motor 33 is connected to a terminal 81 on switch 75. Terminal 81 is electrically connected to a conductor plate 83 which is rotatable with shaft 31. Plate 83 is provided with a notch 85 therein which successively aligns itself with various contacts 77. A remotely located switch 87 is also provided and contains a plurality of contacts 89. Switch 87 also contains a movable contact 91 which is grounded and which may be positioned by a selecting knob 93 to engage contact 91 with one of contacts 89. Each of contacts 89 is connected through a conductor 95 which may be included in a cable connector to a respective one of contacts 77.

Each of contacts 89 and the respective one of contacts 77 to which it is connected corresponds to a particular slide member to be actuated. Accordingly, when contact 91 is moved to engage a contact 89 which is connected to one of contacts 77 not aligned with notch 85, current will flow energizing motor 33. Motor 33 will drive shaft 31 until notch 85 aligns itself with the particular contact 77 which is connected to the contact 89 engaged by movable contact 91. At this point the energizing circuit for the motor will be broken and shaft 31 will stop rotating. By use of this system a particular preprogrammed frequency may be selected by knob 93 and the motor will drive the apparatus through the sequence until that particular slide member operates the tuner to the frequency selected.

It may therefore be seen that the invention provides a pushbutton slide operated tuner which may be actuated by remote control while still being actuable by conventional manual and pushbutton means. The apparatus permits remote control operation of such a tuner from various positions within an automobile and may be readily adapted to use in connection with other types of electronic apparatus.

I claim:

1. Automatic positioning apparatus including in combination, a plurality of linearly displaceable manual positioning members, each being movable to a limit of its displacement to adjust the apparatus to a particular pre-programmed condition, motor driven rotary drive means and means for remotely actuating the same, a plurality of fingers extending from said rotary drive means, each of said fingers being engageable with a respective one of said positioning members for moving the same to the limit of its displacement for adjusting the tuner, and clutch means coupling said fingers to said drive means and individually driving ones of said fingers as said drive means rotates, said clutch means disengaging each of said fingers from said drive means at the limit of displacement of said positioning members engagable therewith.

2. Automatic tuning apparatus for the tuner of a wave signal receiver, including in combination, a plurality of linearly displaceable manual tuning members, each being movable to a limit of its displacement to adjust the tuner to a particular pre-programmed frequency, motor driven rotary drive means and means for remotely actuating the same, a plurality of fingers extending from said rotary drive means, each of said fingers being engagable with a respective one of said tuning members for moving the same to the limit of its displacement for adjusting the tuner, and a clutch associated with each of said fingers, said clutches drivingly coupling successive ones of said fingers with said drive means as said drive means rotates, each of said clutches decoupling said one of said fingers associated therewith from said drive means at the limit of displacement of said tuning member engagable therewith.

3. Automatic tuning apparatus for the tuner of a wave signal receiver, including in combination, a plurality of linearly displaceable manual tuning members, each being movable to a limit of its displacement to adjust the tuner to a particular pre-programmed frequency, a motor driven rotary drive shaft and means for remotely actuating the same, a plurality of fingers extending from said rotary drive shaft and freely rotatable thereon, each of said fingers being engagable with a respective one of said tuning members for moving the same to the limit of its displacement for adjusting the turner, and a detent clutch associated with each of said fingers, said clutches drivingly coupling successive ones of said fingers to said drive shaft as said drive shaft rotates, each of said clutches slipping to decouple said one of said fingers associated therewith from said drive shaft at the limit of displacement of said tuning member associated therewith, whereby actuation of said drive shaft will successively adjust the tuner to each of the particular pre-programmed frequencies associated with the respective ones of said tuning members.

4. Automatic tuning apparatus for the tuner of a wave signal receiver, including in combination, a plurality of linearly displaceable manual tuning members each being movable to a limit of its displacement to adjust the tuner to a particular pre-programmed frequency, a motor driven rotary drive shaft and means for remotely actuating the same, and a plurality of drive units on said drive shaft, each of said drive units comprising a freely rotatable disc having a projecting finger extending therefrom and engagable with a respective one of said tuning members for moving the same to the limit of its displacement for adjusting the tuner, each of said drive units further comprising resilient projecting means extending from said disc and a drive member fixed to said drive shaft and engagable with said resilient projecting means to drive said disc as said drive shaft rotates, said drive members of said drive units being positioned to successively engage said resilient projecting means respectively as said drive shaft rotates and slipping past said projecting means respectively to disengage therefrom at the limit of displacement of said tuning member associated therewith, whereby actuation of said drive shaft will successively adjust the tuner to each of the particular pre-programmed frequencies associated with the respective ones of said tuning members.

5. Automatic tuning apparatus for the tuner of a wave signal receiver, including in combination, a plurality of linearly displaceable manual tuning members each being movable to a limit of its displacement to adjust the tuner to a particular pre-programmed frequency, a motor driven rotary drive shaft and means for remotely actuating the same, and a plurality of drive units on said drive shaft, each of said drive units comprising a freely rotatable disc having a projecting finger extending therefrom and engageable with a respective one of said tuning members for moving the same to the limit of its displacement for adjusting the tuner, said disc having an opening in the surface thereof radially offset from said drive shaft and further having a detent ball resiliently carried in said opening, each of said drive units further comprising a drive member fixed to said drive shaft adjacent said disc, said drive member having an annular ball race therein accommodating said detent ball and further having a detent projection in said ball race for engaging said ball, each of said openings in said discs being in a different radial position relative to said drive shaft, said detent projectons successively engaging said detent balls, respectively, to successively drive said discs and cause said fingers to move said tuning members as said drive shaft rotates, said detent projections slipping past said detent balls disengaging therefrom at the limit of displacement of said tuning member associated therewith, whereby actuation of said drive means will successively adjust the tuner to each of the particular pre-programmed frequencies associated with the respective ones of said tuning members.

6. Automatic tuning apparatus for the tuner of a wave signal receiver, including in combination, a plurality of linearly displaceable manual tuning members each being movable to a limit of its displacement to adjust the tuner to a particular pre-programmed frequency, a motor driven rotary drive shaft and means for energizing said motor, a plurality of fingers extending from said rotary drive shaft and freely rotatable thereon, each of said fingers being engageable with a respective one of said tuning members for moving the same to the limit of its displacement for adjusting the tuner, a detent clutch associated with each of said fingers, said clutches drivingly coupling successive ones of said fingers to said drive shaft as said drive shaft rotates, each of said clutches slipping to decouple said one of said fingers associated therewith from said drive shaft at the limit of displacement of said tuning member associated therewith, and indexing means on said drive shaft for de-energizing said motor upon the slipping of each of successive ones of said clutches, whereby said drive shaft may be rotated to successively adjust the tuner to each of the particular pre-programmed frequencies associated with the respective ones of said tuning members, with said indexing means stopping said drive shaft after movement of each of said tuning members.

7. Automatic tuning apparatus for the tuner of a wave signal receiver including in combination, a plurality of linearly displaceable manual tuning members, each being movable to a limit of its displacement to adjust the tuner to a particular pre-programmed frequency, a motor having an energizing circuit and switch means for controlling the same, a drive shaft coupled to said motor to be driven thereby upon energization thereof, a plurality of fingers extending from said rotary drive shaft and freely rotatable thereon, each of said fingers being engageable with a respective one of said tuning members for moving the same to the limit of its displacement for adjusting the tuner, a detent clutch associated with each of said fingers, said clutches drivingly coupling successive ones of said fingers to said drive shaft as said drive shaft rotates, each of said clutches slipping to decouple said one of said fingers associated therewith from said drive shaft at the limit of displacement of said tuning member associated therewith, and an indexing cam on said drive shaft and engageable with said switch in said motor energizing circuit to open the same and de-energze said motor upon the slipping of each of successive ones of said clutches, whereby rotation of said drive shaft will successively adjust the tuner to each of the particular pre-programmed frequencies associated with the respective ones of said tuning members, said indexing cam operating to stop said drive shaft after movement of each of successive ones of said tuning members.

8. Automatic tuning apparatus for the tuner of a wave signal receiver including in combination, a plurality of linearly displaceable manual tuning members each being movable to a limit of its displacement to adjust the tuner to a particular pre-programmed frequency, a motor driven rotary drive shaft and means for remotely actuating the same, a plurality of fingers extending from said rotary drive shaft and freely rotatable thereof, each of said fingers being engageable with a respective one of said tuning members for moving the same to the limit of its displacement for adjusting the tuner, a detent clutch associated with each of said fingers, said clutches drivingly coupling successive ones of said fingers to said drive shaft as said drive shaft rotates, each of said clutches slipping to decouple said one of said fingers associated therewith from said drive shaft at the limit of displacement of said tuning member associated therewith, and presetable indexing means operable by said drive shaft to de-energize said motor after movement of a predetermined one of said control members corresponding to the presetting of said indexing means, whereby said drive shaft will successively adjust the tuner to each of the particular pre-programmed frequencies associated with the respective ones of said tuning members until a predetermined frequency is reached.

9. The combination as described in claim 8 wherein said presetable indexing means includes a first group of contacts each corresponding to one of said control members and being selectively engageable by a grounded presetable movable contact, a second group of contacts connected in series in said motor energizing circuit and successively disengageable from said motor energizing circuit upon rotation of said drive shaft, and means connecting respective ones of said second group of contacts to respective ones of said first group of contacts, said motor thereby being de-energized when one of said second group of contacts connected to the one of said first group of contacts engaged by said presetable movable contacts is disengaged from said motor energizing circuit, said drive shaft thereby stopping after movement of a particular tuning member corresponding to the presetting of said movable contact.

10. A drive unit for use in automatic positioning apparatus having a linearly displaceable positioning member and a motor driven rotary drive shaft, said drive unit including in combination, a drive member adapted to be fixed on the drive shaft, a freely rotatable disc mounted adjacent said drive member and having a projecting finger extending therefrom for engaging the positioning member to displace the same to a limit of its displacement, said disc further having an opening in the surface thereof radially offset from the drive shaft and carrying a detent ball therein, said drive member having an annular ball race therein accommodating said detent ball and further having a detent projection in said ball race for engaging said ball as said drive member is driven by rotation of the drive shaft, and a resilient plate adjacent said disc and biasing said ball in said ball race, said resilient place yielding to force exerted on said ball by said projection at the limit of travel of the positioning member and permitting said projection to slip past said ball, thereby acting as a clutch to release driving force on the positioning member.

References Cited by the Examiner

UNITED STATES PATENTS

| | | | |
|---|---|---|---|
| 2,742,599 | 4/1956 | Schweighofer | 192—142 |
| 2,762,961 | 9/1956 | Colby | 192—142 |

DON A. WAITE, *Primary Examiner.*